(12) United States Patent
Lin et al.

(10) Patent No.: US 7,449,377 B2
(45) Date of Patent: Nov. 11, 2008

(54) METHOD OF FABRICATING POLY SILICON LAYER

(75) Inventors: Chiung-Wei Lin, Taipei County (TW); Sheng-Chi Lee, Taipei (TW); Yi-Liang Chen, Kaohsiung (TW); Rui-Cheng Huang, Kaohsiung (TW); Te-Hua Teng, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 45 days.

(21) Appl. No.: 11/308,961

(22) Filed: May 30, 2006

(65) Prior Publication Data

US 2007/0281404 A1 Dec. 6, 2007

(51) Int. Cl.
 *H01L 21/84* (2006.01)
(52) U.S. Cl. .............................. 438/166; 257/E21.561
(58) Field of Classification Search ......... 438/151–166; 257/E21.561
See application file for complete search history.

(56) References Cited

U.S. PATENT DOCUMENTS

| | | | | |
|---|---|---|---|---|
| 5,236,865 | A | * | 8/1993 | Sandhu et al. ............... 438/530 |
| 5,474,940 | A | * | 12/1995 | Tsukamoto .................. 438/289 |
| 5,712,191 | A | * | 1/1998 | Nakajima et al. ............ 438/487 |
| 5,773,329 | A |  | 6/1998 | Kuo ............................ 438/162 |
| 2004/0253797 | A1 |  | 12/2004 | Huang et al. |

FOREIGN PATENT DOCUMENTS

| | | |
|---|---|---|
| CN | 1128900 | 8/1996 |
| CN | 1360338 | 7/2002 |
| JP | 01-241862 | 9/1989 |
| JP | 10-070077 | 10/1998 |
| JP | 2000-173922 | 6/2000 |
| TW | 200428664 | 12/2004 |

OTHER PUBLICATIONS

"Rapid Energy. Transfer Annealing for Crystallization of Amorphous Silicon" submitted by Yeu-Long Jiang, Jpn. J. Appl. Phys. vol. 42(2003) pp. L999-L1001.

* cited by examiner

*Primary Examiner*—Richard A. Booth
(74) *Attorney, Agent, or Firm*—Jianq Chyun IP Office

(57) ABSTRACT

A method of fabricating a poly silicon layer comprising the following steps is provided. First, a substrate is provided and an amorphous silicon layer is formed on the substrate. A patterned metal layer is formed on the amorphous silicon layer. Next, a pulsed rapid thermal annealing process is performed to form a metal silicide between the patterned metal layer and the amorphous silicon layer, wherein the patterned metal layer and the amorphous silicon layer are adopted for conducting thermal energy to the amorphous silicon layer such that the amorphous silicon layer is converted into a polysilicon layer. Finally, the patterned metal layer is removed. Accordingly, the above processes may prevent the poly silicon layer from metal contamination.

6 Claims, 4 Drawing Sheets

METHOD OF FABRICATING POLY SILICON LAYER

BACKGROUND OF THE INVENTION

1. Field of the Invention

The present invention generally relates to a film and method of fabricating the same, and more particularly, to a polysilicon layer and method of fabricating the same.

2. Description of Related Art

A display serves as a communication interface for human to acquire information from a device, and the flat panel display (FPD) is the current trend in the display market. The FPD can be classified into various types including an organic electro-luminescence display (OLED), a plasma display panel (PDP), a liquid crystal display (LCD), a light emitting diode (LED) and so on.

The above-mentioned display usually employs the thin film transistor (TFT) as the switch of the display. Generally speaking, the TFT may be classified into mainly two types including an amorphous silicon TFT and a low-temperature poly silicon thin film transistor (LTPS TFT). Compared with the conventional amorphous silicon TFT, since the electron mobility of the LTPS TFT may exceed 200 cm2/V-sec, the area of the LTPS TFT is smaller to meet the requirement of high aperture ratio.

The poly silicon layer serving as the channel layer of the LTPS TFT may be fabricated by the following methods.

1. Furnace annealing (FA) process combining with solid phase crystallization (SPC)—the disadvantage of this method lies in that the operation temperature is too high (more than 600° C.) and the required time for the thermal process is too long (more than 15 hours). Besides, when using a glass substrate, the glass substrate is likely to become deformed due to the high temperature.

2. Excimer laser crystallization (ELA) process—the disadvantage of this method lies in that the equipment is more expensive, the processing time is longer and the surface roughness of the poly silicon layer is poor.

3. Metal induced lateral crystallization (MILC) process—the disadvantage of this method lies in that the poly silicon film has metal contamination. Besides, since the individual grain size is too small, the size of the grain can only be represented by the range value.

4. Rapid energy transfer annealing (RETA) process—the disadvantage of this method lies in that the process adopts a wafer as a heating plate, and therefore this method may not be applied to the large-sized substrate.

SUMMARY OF THE INVENTION

Accordingly, the present invention is directed to a method of fabricating a polysilicon layer for preventing metal contamination.

The present invention is also directed to a polysilicon layer having comparatively larger grains size.

As embodied and broadly described herein, the present invention is directed to a method of fabricating a polysilicon layer comprising the following steps. First, a substrate is provided and an amorphous silicon layer is formed on the substrate. A patterned metal layer is formed on the amorphous silicon layer. Next, a pulsed rapid thermal annealing (PRTA) process is performed to form a metal silicide between the patterned metal layer and the amorphous silicon layer, and the patterned metal layer and the metal silicide are adapted for conducting thermal energy to the amorphous silicon layer such that the amorphous silicon layer is converted into a polysilicon layer. Finally, the patterned metal layer is removed.

According to an embodiment of the present invention, a material of the patterned metal layer comprises nickel, cobalt, copper, tantalum, iron or platinum.

According to an embodiment of the present invention, an operation temperature of the pulsed rapid thermal annealing process is between 550° C. and 900° C.

As embodied and broadly described herein, the present invention also provides a polysilicon layer formed according to the above-mentioned fabrication method. The grains of the poly silicon layer are spherical in shape.

According to an embodiment of the present invention, the grain size is larger than 4000 angstrom.

According to an embodiment of the present invention, the surface roughness of the poly silicon layer is smaller than 10 angstrom.

In accordance with the foregoing descriptions, the present invention employs the pulsed rapid thermal annealing process for forming the metal silicide and the patterned metal layer and the amorphous silicon layer may conduct thermal energy to the amorphous silicon layer to transform the amorphous silicon layer into a polysilicon layer. Compared with the conventional MILC, since the metal silicide of the present invention is not likely to laterally migrate, the occurrence of the metal contamination may be effectively reduced. In addition, compared with the conventional ELA process, the fabrication method provided by present invention may manufacture poly silicon layers with comparatively larger gain size.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
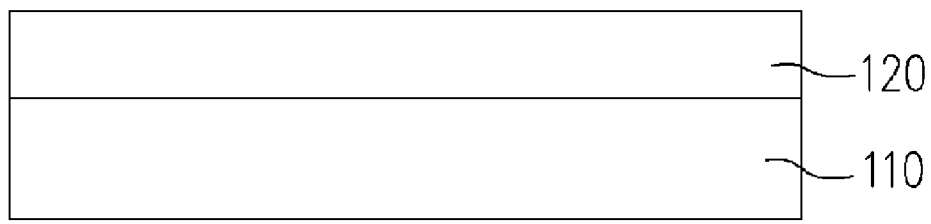
FIGS. 1A to 1F are schematic, cross-sectional diagrams illustrating the process flow for fabricating a poly silicon layer according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are schematic cross-sectional diagrams illustrating the process flow for fabricating a poly silicon layer according to an embodiment of the present invention. Referring to FIG. 1A, the method of fabricating a polysilicon layer according to an embodiment of the present invention comprises the following steps. First, a substrate 110 is provided, and the substrate 110 may be a glass substrate or a quartz substrate. Next, an amorphous silicon layer 120 is formed on the substrate 110. The amorphous silicon layer 120 may be formed using, for example, a chemical vapor deposition (CVD) process or a plasma enhanced CVD (PECVD) process.

Figure 1B:
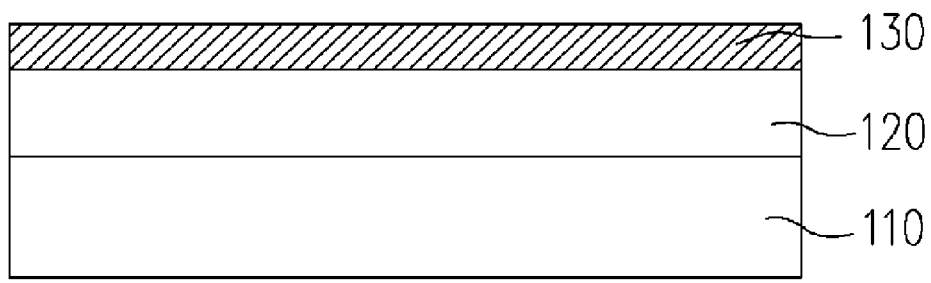

Referring to FIG. 1B, a metal layer 130 is formed on the amorphous silicon layer 120, and the metal layer 130 may be comprised of nickel, cobalt, copper, tantalum, iron, platinum or any other metallic material and may be formed by using, for example, a sputtering process.

Figure 1C:
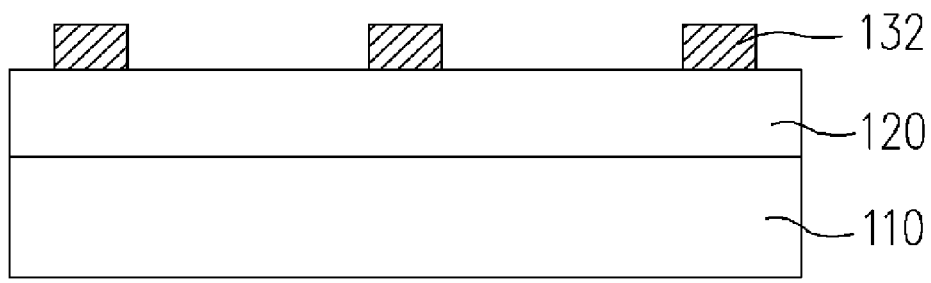

Referring to FIG. 1C, a portion of the metal layer 130 is removed to form a patterned metal layer 132. A portion of the metal layer 130 may be removed by using, for example, a photolithography process and an etching process.

Figure 1D:
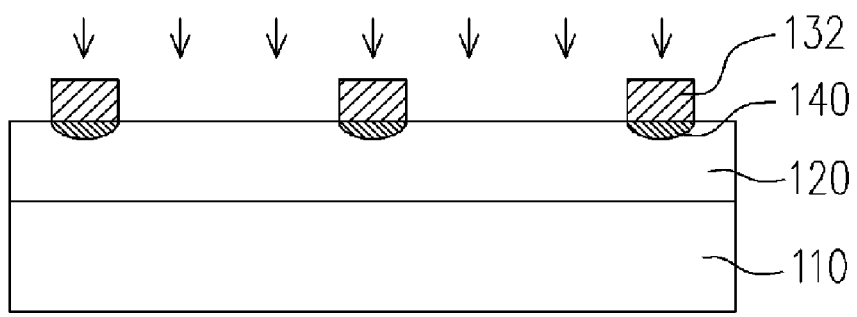
Figure 1E:
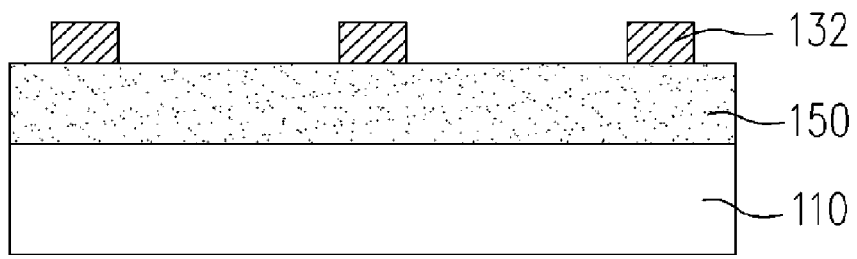

Referring to FIG. 1D, a PRTA process is performed to form a metal silicide 140 between the patterned metal layer 132 and the amorphous silicon layer 120. Next, during the PRTA process, the patterned metal layer 132 and the metal silicide 140 conduct thermal energy to the amorphous silicon layer 120 such that the amorphous silicon layer 120 is transformed into a polysilicon layer 150 as shown in FIG. 1E.

Figure 2:
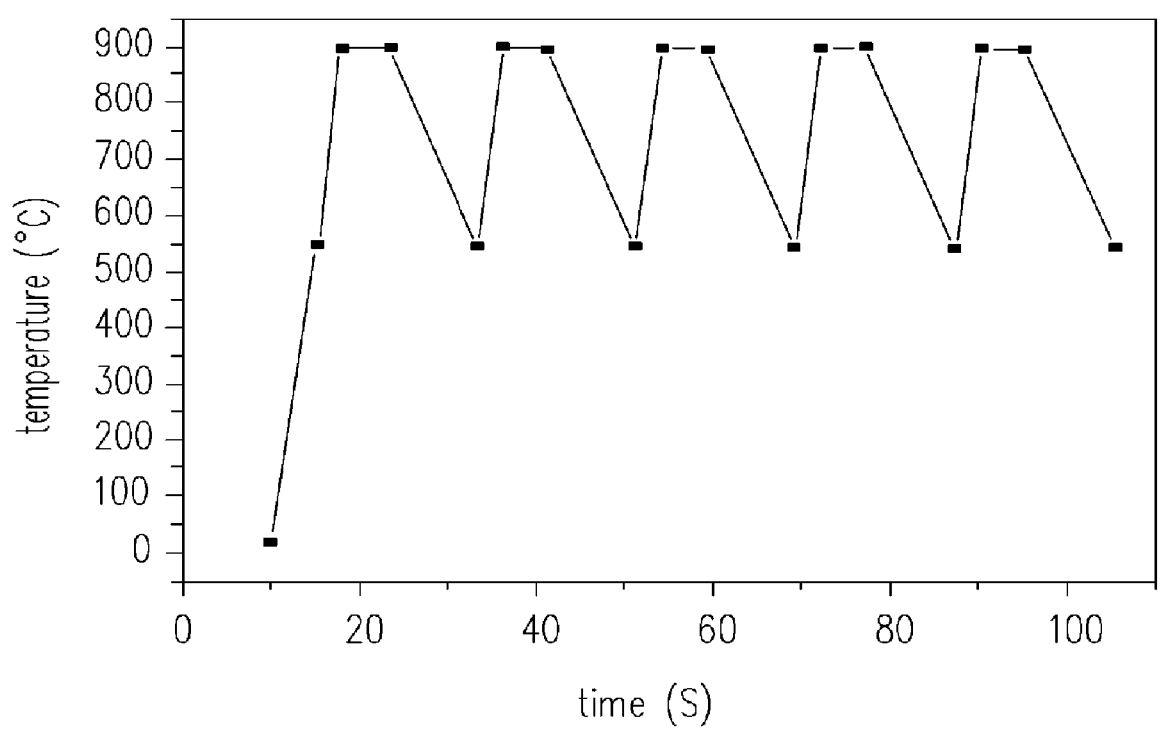
FIG. 2 is a diagram showing a heating curve of the PRTA process according to an embodiment of the present invention.

FIG. 2 is a diagram showing a heating curve of the PRTA process according to an embodiment of the present invention. Referring to FIGS. 1D and 2, the horizontal coordinate represents time, wherein a unit of time is one second, and the vertical coordinate represents temperature, wherein centigrade represents the units used for the degrees of temperature. For example, the operation temperature of the PRTA process is between 550° C. and 900° C. In addition, for each cycle, the high temperature (900° C.) lasts for 5 seconds, the slope for heating is 70° C./second and the slope for cooling is 35° C./second. More specifically, a seed metal silicide 140 serving as crystal seed may be formed in advance. Next, infra red energy generated from the PRTA process is converted to heat by the metal suicide 140 and the patterned metal layer 132, and then heat is conducted to the amorphous silicon layer 120 to make it crystallize. In other words, the mechanism of re-crystallization is a kind of SPC-like method.

Figure 1F:
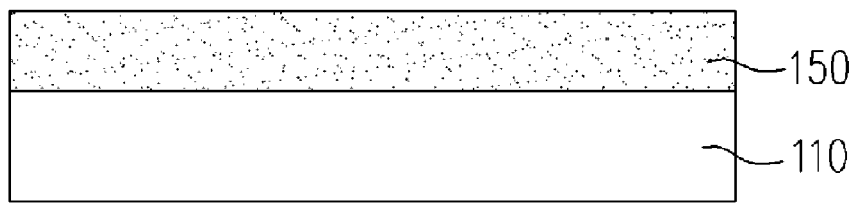

Referring to FIG. 1F, the patterned metal layer 132 is removed, and the patterned metal layer 132 may be removed by an etching process. Thus, the method of fabricating the polysilicon layer 150 according to an embodiment of the present invention is complete.

Since the conventional MILC process utilizes the lateral migration of the metal silicide to induce the amorphous silicon layer to re-crystallize, and therefore the lateral crystallization region (a region which is not covered by the patterned metal layer 132 shown in FIG. 1D) may have metal contamination. The poly silicon layer is analyzed by an energy dispersive X-ray spectrometer (EDS), and the result is shown as follows.

Figure 3:
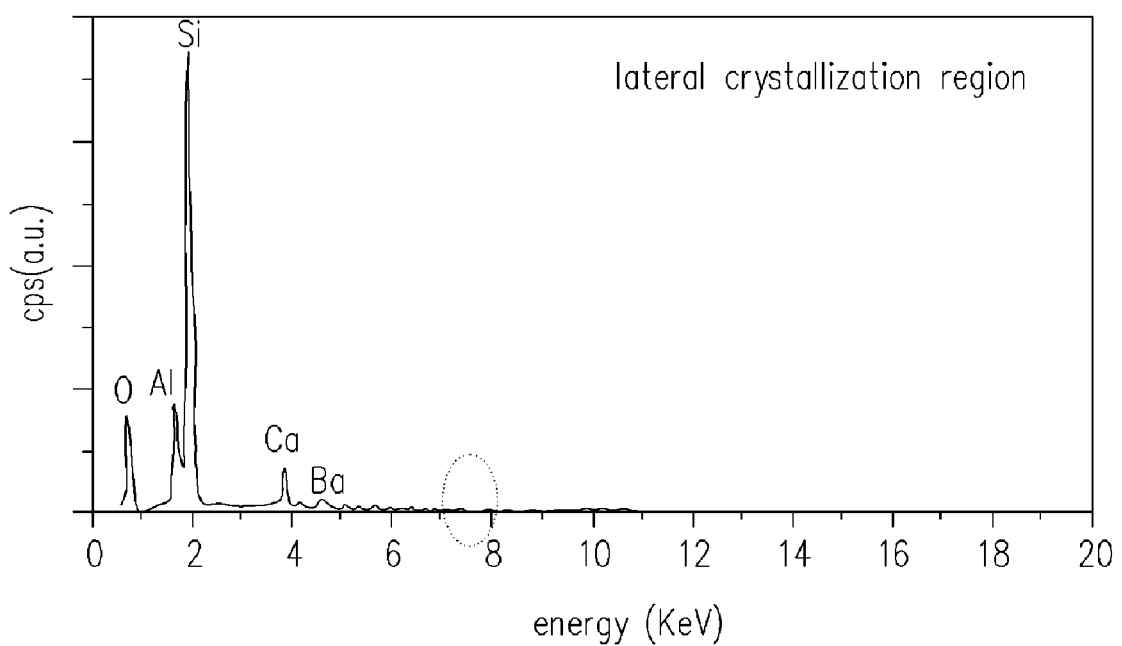
FIG. 3 is a spectrum diagram of the poly silicon layer measured by an energy dispersive X-ray spectrometer.

FIG. 3 is a spectrum diagram of the poly silicon layer measured by an energy dispersive X-ray spectrometer. Referring to FIG. 3, the horizontal coordinate represents energy, wherein a unit of energy is one kiloelectron volt (KeV), and the vertical coordinate represents counts per second (cps). The metal silicide of the present invention may not migrate laterally, and therefore the signal of nickel within the lateral crystallization region is not obvious (such as the dotted line region in FIG. 3). In other words, the lateral crystallization region has negligible amount of nickel.

Referring to FIG. 1F, the grains of the poly silicon layer formed by the conventional ELA process, are arborization. However, the grains of the poly silicon layer 150 formed according to the above-mentioned processes are substantially spherical in shape. Since the metal silicide makes the generation of a portion of the nucleation sites earlier, therefore the nucleation density is significantly reduced and the polysilicon layer 150 has larger grains size. Compared to the size of the grains of the poly silicon layer formed by the conventional ELA process, which is about 3000 angstrom to 4000 angstrom, the size of the grains of the polysilicon layer formed according to the above-mentioned processes may be larger than 4000 angstrom. Besides, compared to the surface roughness of the poly silicon layer formed by the conventional ELA process is between dozens to hundreds of nanometers, but the surface roughness of the polysilicon layer formed by the above-mentioned process may be smaller than 10 angstrom.

In summary, the present invention has at least the following advantages.

1. Compared to the conventional SPC process, the present invention is faster (less than 2 minutes). The present invention employs the PRTA process, and accordingly it is suitable for forming a polysilicon layer on every kind of substrate.

2. Compared to the conventional ELA process, the equipment required by the present invention is cheaper and the processing time thereof is faster (less than 2 minutes). Additionally, the planarity of the polysilicon layer formed according to the present invention is better, which is less than 10 angstrom.

3. Compared with the conventional MILC process, the metal contamination of the present invention may not migrate laterally, and therefore the metal contamination may be effectively avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a poly silicon layer, comprising the following steps:
  providing a substrate and forming an amorphous silicon layer on the substrate;
  forming a patterned metal layer on the amorphous silicon layer;
  performing a pulsed rapid thermal annealing process to form a metal silicide between the patterned metal layer and the amorphous silicon layer, and the patterned metal layer and the metal silicide being adapted for conducting thermal energy to the amorphous silicon layer such that the amorphous silicon layer is converted into a polysilicon layer; and
  removing the patterned metal layer.

2. The method of fabricating a poly silicon layer according to claim 1, wherein a material of the patterned metal layer comprises nickel, cobalt, copper, tantalum, iron or platinum.

3. The method of fabricating a poly silicon layer according to claim 1, wherein an operation temperature of the pulsed rapid thermal annealing process is between 550° C. and 900° C.

4. A method of fabricating a poly silicon layer, comprising the following steps:
  providing a substrate;
  forming an amorphous silicon layer on the substrate;
  forming a metal layer on the amorphous silicon layer;
  patterning the metal layer to form a patterned metal layer exposing a portion of the amorphous silicon layer;
  performing a pulsed rapid thermal annealing process to form a metal suicide between the patterned metal layer and the amorphous silicon layer;
  continuously performing the pulsed rapid thermal annealing process for conducting thermal energy to the amorphous silicon layer from the metal suicide, such that the amorphous silicon layer is converted into a polysilicon layer; and
  removing the patterned metal layer.

5. The method of fabricating a poly silicon layer according to claim 4, wherein a material of the patterned metal layer comprises nickel, cobalt, copper, tantalum, iron or platinum.

6. The method of fabricating a poly silicon layer according to claim 4, wherein an operation temperature of the pulsed rapid thermal annealing process is between 550° C. and 900° C.

* * * * *